US008828649B2

(12) United States Patent
Bradley et al.

(10) Patent No.: US 8,828,649 B2
(45) Date of Patent: Sep. 9, 2014

(54) METHOD OF PATTERNING A THIN FILM

(75) Inventors: Donal Bradley, Beaconsfield Bucks (GB); John De Mello, Teddington (GB); Jingsong Huang, London (GB)

(73) Assignee: Imperial Innovations Limited (GB)

( * ) Notice: Subject to any disclaimer, the term of this patent is extended or adjusted under 35 U.S.C. 154(b) by 727 days.

(21) Appl. No.: 12/094,070

(22) PCT Filed: Nov. 15, 2006

(86) PCT No.: PCT/GB2006/004261
§ 371 (c)(1),
(2), (4) Date: May 16, 2008

(87) PCT Pub. No.: WO2007/057664
PCT Pub. Date: May 24, 2007

(65) Prior Publication Data
US 2008/0278068 A1    Nov. 13, 2008

(30) Foreign Application Priority Data

Nov. 17, 2005 (GB) .................................. 0523437.2

(51) Int. Cl.
*G03F 7/20* (2006.01)
*B32B 3/10* (2006.01)

(52) U.S. Cl.
USPC ....................................... 430/319; 428/195.1

(58) Field of Classification Search
CPC ........... G03F 7/0007; G03F 7/11; G03F 7/20; G03F 7/30; G03F 7/0236; H01L 51/0023
USPC .................. 430/311, 319, 324; 428/195.1
See application file for complete search history.

(56) References Cited

U.S. PATENT DOCUMENTS

| 5,447,824 A | 9/1995 | Mutsaers et al. | |
| 5,834,071 A * | 11/1998 | Lin ................................. | 427/578 |
| 6,649,327 B2 | 11/2003 | Kim et al. | |
| 2004/0131779 A1* | 7/2004 | Haubrich et al. ............. | 427/261 |
| 2005/0040500 A1* | 2/2005 | Henmi ........................... | 257/659 |
| 2006/0068305 A1* | 3/2006 | Iriguchi ......................... | 430/22 |
| 2006/0082710 A1* | 4/2006 | Kitson ........................... | 349/139 |

FOREIGN PATENT DOCUMENTS

| EP | 0 399 299 A2 | 11/1990 |
| EP | 1 566 987 | 8/2005 |
| WO | WO 99/47976 | * 9/1999 |
| WO | WO 03/086024 | 10/2003 |

OTHER PUBLICATIONS

Huang, J. et al., Adv. Funct. Mater. 2005, 2, 290.).

(Continued)

*Primary Examiner* — Brittany Raymond
(74) *Attorney, Agent, or Firm* — Warner Norcross & Judd LLP

(57) ABSTRACT

A method of patterning a thin film, comprising: depositing an intermediate, radiation sensitive, layer on a substrate; depositing the thin film on the intermediate layer, before or after deposition of the thin film: exposing the intermediate layer to patterned radiation in order to initiate a chemical reaction therein; and removing patterned radiation-defined parts of the intermediate layer and corresponding thin film, to leave patterned thin film and patterned intermediate layer on the substrate.

23 Claims, 11 Drawing Sheets

(56) References Cited

OTHER PUBLICATIONS

Burn, P.L. et al. "Chemical Tuning of Electroluminescent Copolymers to Improve Emission Efficiencies and allow Patterning," Nature 356 (1992), 47-49.

Jonda, Ch., et al; Surface roughness effects and their influence on the degradation of organic light emitting devices; Journal of Materials Science 35 (2000) 5645-5651.

* cited by examiner (A)

(B)

(C)

(D)

(A) Glass/Baytron P (1.53nm)

(B) Glass/SU8/BaytronP (1.55nm)

(A) Blue Pixel (B) Green Pixel (C) Red Pixel

METHOD OF PATTERNING A THIN FILM

CROSS-REFERENCE TO RELATED APPLICATIONS

This application is a United States National Phase filing under 35 USC 371 of PCT/GB06/004261 filed Nov. 15, 2006, which claims priority to GB 0523437.2 filed Nov. 17, 2005, both of which are incorporated herein by reference.

BACKGROUND OF THE INVENTION

The present invention relates to a method of patterning a thin film, and in particular but not limited to a method of selectively patterning organic thin films on a substrate.

There is considerable interest in patterning technologies that allow micron resolution 'patterns' or geometric features to be produced in thin film structures, reproducibly and at low cost. These techniques are of particular interest for the fabrication of electronic, optoelectronic and photonic devices based on organic semiconductors. These materials have attracted attention due to their applications in displays, imaging, analysis, communications and sensor systems, where high throughput, low temperature manufacture compatible with flexible substrates is a prominent driver for commercialization.

The process of forming high-resolution patterned films by deposition of the film to be patterned, followed by conventional photo, electron-beam, and X-ray lithography, is well established and commonly used to fabricate inorganic semiconductor devices, such as silicon integrated circuits. Typical processes are the patterning of contacts, electrical interconnects, and insulators. The important interface in each case is the interface between the film to be patterned and the underlying inorganic semiconductor wafer, conventionally a crystalline material fabricated at high temperature. Conventional lithography involves the provision of, for example, a negative photoresist on top of the film to be patterned (referred to as the active layer). After irradiation the unexposed photoresist must be removed, then the unexposed thin film regions no longer protected by the removed photoresist must be removed, and then the remaining upper layer of exposed photoresist itself needs to be removed. For a positive resist the nature and handling of the exposed/unexposed regions is reversed. The sequence of process steps in which the photoresist is deposited on top of the film to be patterned is also the method used in conventional semiconductor device manufacture.

Another patterning technique proposed is the so-called "lift-off" process for patterning metal contact layers on a substrate structure. The lift-off process involves depositing a photoresist layer on the substrate, exposing the photoresist with the desired pattern, developing the photoresist to remove unwanted regions thereof, coating the thus patterned photoresist with the active material to be patterned and then removing the remaining photoresist, lifting off the unwanted regions of the material in the process. After lift-off, the patterned material is left in direct contact with the substrate and no photoresist remains.

In recent years, optical, electro-optic and electronic devices based on organic materials have been developed. Such devices offer the commercial potential of producing high volumes at low cost. However, it has been found that the conventional photoresist patterning techniques, including the lift-off method, applied to inorganic materials cannot readily be applied to organic thin films. Conventional photoresist patterning has limited applicability to organic semiconductor thin films, owing for instance to its detrimental effects on the optoelectronic properties of the organic film. The organic film often possesses chemical characteristics in common with the typical sacrificial photoresists that are used in conventional photolithography and hence can be inadvertently and unfavorably altered by the photoresist treatment process. The use of thermal baking steps, and exposure to a range of different solvents/etchants is especially problematic.

Conventional photolithography has not been found suitable for organic functional materials, and has been found problematic for applications such as organic electroluminescent full color display fabrication where multiple steps are needed to sequentially deposit red, green, and blue picture elements, or pixels. Conventional lithography can not be used in the direct patterning of organic semiconductor layers during commercial manufacture of such display devices. Evidence of the recognized need for an applicable photolithography for functional organic materials comes from the patent literature where photolithographic approaches for patterning organic functional materials have been proposed (e.g. EP 1566987 and WO03086024). However, these approaches continue to use the approach of conventional photolithography in which the photoresist is deposited on top of the thin film to be patterned. They are thus adaptations of the conventional photolithography method. They further require several additional steps to be inserted into the typical process sequence and require specific materials attributes to be engineered and thus add complexity and cost. A simple, widely applicable approach is thus still very much needed.

Alternative patterning techniques, such as inkjet printing, shadow-mask evaporation of small molecules, thermal transfer processes and scanned laser patterning all have limitations, such as insufficient resolution, poor scalability to larger substrate sizes, difficulty in ensuring pattern registration between sequential steps, and complex, costly, processing protocols. To achieve adequate resolution of features with ink jet printing, for instance, the substrate must be patterned with well-like receptacles into which the ink droplets can be deposited. Shadow mask evaporation of small molecules requires a similar patterning of the substrate to provide separator banks. These substrate-patterning procedures involve a plurality of photolithographic steps and, in the case of ink-jet printing, surface plasma treatment is required to adjust the philicity of the walls between the receptacles and thus ensure that any material falling on the walls will flow into the nearest receptacles. In both cases this adds considerable complexity and cost and is widely seen as an issue for economic manufacturing. This has led to the development of several other patterning approaches that involve direct modification of the thin film layer by light-induced chemistry. This can be destructive photochemistry, or light activated/deactivated redox chemistry, or other processes. The materials must be specifically engineered to have the required photochemical characteristics for use in this approach, which still suffers from significant problems.

As an example of a light-activated redox chemistry approach, specifically relating to the generation of conductive patterns, it has been proposed (U.S. Pat. No. 5,447,824) to polymerize a thiophene monomer, namely 3,4 ethylenedioxythiophene (EDOT), mixed with a solution of an oxidizing agent, by selective ultraviolet (UV) radiation and heat, which renders the film insulating in the exposed areas and conducting in the non-exposed areas. The polymer layer must then be treated with methanol, water or 1-butanol to reduce the remaining oxidizing agent. This problematically leaves residues of the chemical reaction trapped within the film that can have a detrimental effect on the film's properties and, further, the exposed (ideally insulating) areas show appreciable conductivity.

A similar method (EP-A-399299) of patterning a conductive polymer uses a mixture of a conjugated polymer, namely polyaniline, and a photo-acid generator, which generates free acid upon UV irradiation. In this method, the components are dissolved in a common solvent and films are then spin-coated onto a substrate from solution. They are subsequently heated and then illuminated with a UV light source through a photomask and then further heated, causing the UV-exposed areas of the polymer layer to become electrically conductive (with the adjacent non-exposed areas remaining non-conductive). Unfortunately, the resulting conductivity of the exposed areas is relatively low (typically less than 0.1 S/cm), which is inadequate for most electrode applications. The problematic issue of trapped residues also applies here.

The above techniques rely on localized modification of the film conductivity to achieve the desired patterning, either by lowering the conductivity of an initially conductive film or by increasing the conductivity of an initially non-conductive film. Their main limitation, however, is the difficulty of producing films with sufficiently high differential conductivity between the exposed and un-exposed regions (i.e. films in which the "conductive" zones have sufficiently low surface resistance and the "insulating" zones have sufficiently high surface resistance).

Another approach involves localized removal of the conducting material exposing an insulating substrate below. This is similar to conventional lithographic patterning that works via the removal of unwanted material rather than local modification of properties. For instance Kim et al reported that direct photoirradiation was an effective means of removing PEDOT:PSS from glass, silicon and polyethyleneterepthalate (PET) substrates (U.S. Pat. No. 6,649,327). The substrates were first treated with $O_2$ plasma to enhance the hydrophilicity of the surface and, after spin coating PEDOT:PSS doped with glycerol, the substrates were heated to 200° C. for approximately five minutes in order to anneal the active layer. The PEDOT:PSS film was subsequently washed with methanol and dried with $N_2$ gas. It was then irradiated using a 254 nm UV lamp through a patterned photomask. The UV light was reported to weaken the adhesion between the PEDOT:PSS and the substrate, allowing for its subsequent removal by sonication in water, alcohol or a mixture of the two for 1 to 20 seconds. Kim et al reported that the surface resistance and optical transparency of the unexposed regions of the films were unaffected by the treatment, but the method may be sensitive to the sonication conditions because poly(styrenesulfonate) is very hygroscopic and PEDOT:PSS can show marked changes in work function in the presence of water (J. Huang, P. F. Miller, J. S. Wilson, A. J. de Mello, J. C. de Mello, D. D. C. Bradley, Adv. Funct. Mater. 2005, 2, 290.). This is potentially problematic for many electronic applications, where injection and/or collection of charges at the electrode-organic semiconductor interface is highly work function dependent.

Similar approaches have been proposed for patterning instead an emissive organic semiconductor layer by using UV exposure to selectively photochemically control the emission properties e.g. via photobleaching of chromophores or by selective elimination of leaving groups from a precursor polymer (c.f. "Chemical Tuning of Electroluminescent Copolymers to Improve Emission Efficiencies and allow Patterning" P. L. Burn, A. B. Holmes, A. Kaft, D. D. C. Bradley, A. R. Brown, R. H. Friend, and R. W. Gymer *Nature* 356 (1992), 47-49).

It will be evident that the above-described light-induced chemical patterning methods do not provide the desired simple, widely applicable approach to patterning organic functional materials.

In specific relation to conducting polymers, there remains a need for a simple, convenient process for preparing patterned conducting polymer surfaces, which provides very low conductivity in regions that are meant to be insulating and a high differential conductivity between the conducting and insulating zones, whilst also preserving optical transparency. This is important for instance in defining the electrode structures for devices such as transistors, photodiodes, and light emitting diodes. In addition, there is a need to provide a method for the patterning of multiple organic light-emitting/absorbing materials for use in multicolor displays and imaging applications.

SUMMARY OF THE INVENTION

It is the object of the present invention to at least alleviate some of the problems with the prior art, and to provide a simple, versatile and convenient patterning method for thin film materials.

The present invention is set out in the independent claims. Some optional features are set out in the claims dependent thereto.

A method of patterning is described which makes use of an intermediate photosensitive layer or photoresist located between a coated or uncoated substrate and a thin film layer to be patterned. The thin film layer to be patterned may comprise small molecule organic compounds, polymers, inorganic semiconductors and dielectrics, metals, and hybrids of such materials. The intermediate photosensitive layer is irradiated (exposed) through a photo mask, or by means of another intensity pattern defining method, and a chemical reaction is initiated in the exposed intermediate photoresist layer to render exposed parts insoluble or soluble in a developer that is used to selectively remove the unwanted parts of the exposed intermediate layer and overlying parts of the thin film layer.

In other aspects, different pattern-intensity defining methods include creating interference or diffraction patterns on the radiation sensitive layer or using image forming devices such as spatial light modulators, micromirror devices and microarray sources that comprise a plurality of individual emission elements. The radiation used to expose the resist can be provided by a UV, electron beam or X-ray source, provided that the resist is selected to have appropriate sensitivity to such radiation. Hence, the use of the terms photoresist, photolithography, photosensitive, irradiation and radiation includes electron-beam and X-ray based procedures also. The use of these latter techniques is expected to enable the patterning of higher resolution (sub-micron) features.

Preferably the active layer does not prevent the removal of the unwanted part of the intermediate photosensitive material from under it and the thin film has no compatible solvents with the intermediate layer—it is insoluble in, but porous/permeable to, a solvent that will be used in the removing step to remove unwanted parts of the intermediate radiation sensitive layer.

The present invention has the obvious advantage of being convenient to use, and simple. It reduces the number of process steps required compared to the known art, with the active layer and the intermediate layer in effect being simultaneously patterned in a single development step. There is no requirement, in terms of the specific thin film to be patterned, to remove in a second step the part of the intermediate layer not removed in the first step since here it lies below the thin film and does not obstruct the deposition of additional layers on top. The method facilitates patterning of thin film materials at near-micron resolution on a plurality of substrates and does so without causing unfavorable changes in the desired properties of the patterned material. For instance, the method facilitates patterning of semiconductor devices on plastic-substrates where low-temperature processing is required by the thermo-mechanical properties of the substrate. Such devices offer access to high-throughput manufacturing processes, light weight and robust structures for portable applications, and flexible and conformable structures for wearable applications. Further, the method allows standard materials to be patterned without an added need for chemical modification or redesign. The requirements for patterned organic semiconductor and insulator films, for applications including but not limited to thin film transistors and memory elements, are also addressed by the present invention. The process is compatible with the patterning of a plurality of different material types and offers a general method suitable for the fabrication of a plurality of plastic substrate based devices, including patterning of low temperature deposited metals and other inorganic materials including dielectric oxides, semiconductors and phosphors.

Using this approach ensures further that the problem of trapped chemical residues faced in photopatterning via chemical modification of the film is minimized. In the specific case of conducting polymer films, the method facilitates good conductive characteristics—in particular, a high differential between conducting and insulating zones is obtained. The method of the present invention is a cost-effective method of patterning that is widely applicable to a plurality of optical, electronic, optoelectronic and photonic devices including multi-color polymer light emitting diode displays. It allows the use of known readily available equipment and materials and the use of low temperature processing techniques. Moreover, unlike ink-jet printing and shadow-mask evaporation of small molecules for display applications, it does not require a pre-patterning of the substrate to achieve an adequate resolution.

The photosensitive, radiation or irradiation sensitive property of the intermediate layer may be photoinduced polymerization, cross-linking, chain scission, or another similar chemical reaction as used in a positive or negative photoresist. Preferably the intermediate layer comprises epoxidized bisphenol-A/formaldehyde novolac co-polymer (SU8). SU8, in the presence of an appropriate photo acid generator, favorably becomes a negative resist. It has a number of advantageous characteristics, including good film forming properties, good adhesion, simple processing, high optical transmission and, when cross-linked, excellent chemical and thermal stability. SU8 can also, favorably, be deposited on a variety of substrate surfaces, and in general other thin films adhere well to it.

The substrate, onto which are deposited the intermediate radiation sensitive layer and the thin film layer to be patterned, may be flexible or rigid, and may be selected from, but not limited to, silicon, quartz, glass, and a plurality of plastics, including but not limited to polyethyleneterepthalate, polycarbonate, and polyimide. It may be transparent, including but not limited to quartz, glass, and polyethyleneterepthalate, or opaque, including but not limited to Si and Fr4 circuit board, since exposure of the photoresist may be performed from either side, passing through or not passing through the substrate.

In one embodiment, the photomask used to define the exposed areas of the intermediate layer is held on a separate mask plate and is placed in contact with, or in close proximity to, the active layer and the underlying intermediate layer.

In the case of transparent substrates such as glass, quartz and polyethyleneterepthalate, the intermediate photoresist layer can be illuminated through the substrate, providing the option of using the substrate itself to achieve the patterning. In this case the substrate may comprise a pre-patterned layer that acts as the exposure mask. Advantageously, this removes the need for a mask aligner to achieve registration between the mask and substrate. The substrate may be patterned to form an exposure mask by a number of processes, including but not limited to, the thermal evaporation, photolithography, sputtering, thermal transfer, planographic printing or inkjet printing. Advantageously, this self-aligned mask procedure is well suited to the geometiy of field effect transistor (FET) structures where the mask pattern would contain either a source and drain contact pattern or a gate contact pattern on the substrate. The process defined by the present invention then allows the gate or the source and drain contacts, respectively to be fabricated in a favorably aligned geometry without the need for a separate mask and alignment procedure.

In one aspect of the self-aligning mask method, the mask is prepared on a side of the substrate adjacent to the photosensitive layer, which facilitates high resolution patterning due to the proximity of the substrate mask to the intermediate photoresist layer. This may be required when the mask structure is an integral part of the device being fabricated. In an alternative, the mask is prepared on the side of the substrate facing away from the thin film to be patterned, allowing, if so desired, the pattern to be removed from the substrate after patterning of the thin film layer has been completed.

In one embodiment, removing the pre-patterned mask layer comprises applying sonication. Sonication advantageously accelerates removal.

In another embodiment, the radiation is effectively patterned by scanning a well defined beam, such as a laser beam, across the film to trace out a pattern of a photomask.

BRIEF DESCRIPTION OF THE DRAWINGS

The present invention can be put into practice in several ways. Specific embodiments will now be described by way of example, with reference to the accompanying drawings in which.

DESCRIPTION OF THE CURRENT EMBODIMENT

Figure 1:
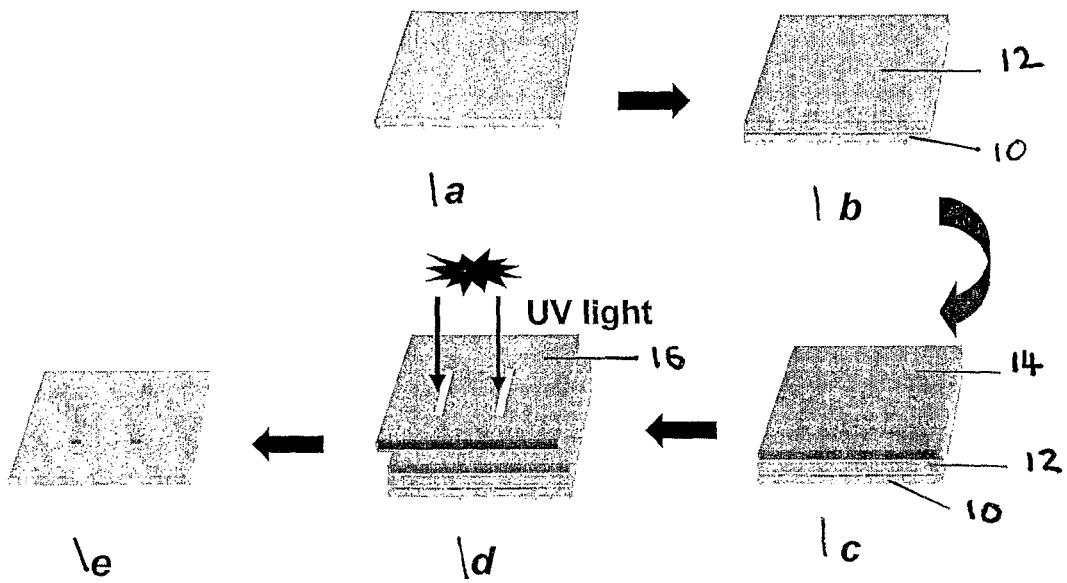
FIG. 1 is a schematic illustration of the deposition of layers, and radiation of the thin film through a mask, according to a first embodiment of the present invention.

To describe the method in further detail, reference is made to FIG. 1. In step 1A, a substrate 10 is provided comprising a polyethyleneterepthalate (PET) sheet. The substrate is first cleaned thoroughly by sonication in a detergent solution for 10 minutes, rinsing in de-ionized water three times (each time for 10 minutes), then in acetone for 5minutes, and finally in isopropanol for 5 minutes. The substrate 10 is then dried with nitrogen and left on a hot-stage at 80° C. for an hour to drive off residual solvent. The substrate may be coated or uncoated in alternative embodiments.

In step 1B of FIG. 1, an intermediate layer 12 of fully epoxidized bisphenol-A/formaldehyde novolac co-polymer (SU8 as purchased from Microchem) is spin-coated onto the substrate 10 at spin speeds preferably between 500 and 5000 rpm. In the case of one formulation of SU8 known as SU8-2, to evaporate the solvent and densify the film, the SU8 film is preferably baked on a level hot plate at 65° C. for one minute and at 95° C. for a further minute.

In step 1C, a thin film layer, thin film 14, of conducting polymer poly (3,4-ethylenedioxythiophene):poly(styrene-sulphonate) (PEDOT:PSS), Baytron P supplied by H.C. Starck GmbH, is spin-coated on top of the SU8 layer as an aqueous dispersion, after prior filtering with a 0.45 μm PVDF filter. Spin speeds are preferably between 500 and 5000 rpm for 180 seconds. A small of amount of a dopant such as sorbitol may be added as required (not shown here) to the PEDOT:PSS solution before spin-coating to enhance film conductivity. After spin-coating the PEDOT:PSS film is preferably left to dry naturally.

As shown in step 1D, the patterning is achieved by using patterned radiation, that is, in the present embodiment, irradiating the SU8 layer through a photomask 16 with a near-UV light source (typical wavelength in the optical range between 350 and 550 nm, here preferably between 350 and 400 nm). In an alternative, for a transparent substrate, the mask can also be placed on the opposite side of the substrate to the active layer and irradiated from that opposite side. The SU8 layer is a negative photoresist, and after irradiation, exposed parts are insoluble in the subsequently-used developer. Alternatively a positive photoresist can be used, in which case the exposed parts are soluble in the subsequently-used developer. The layer of SU8 is illuminated through the mask 16 for 20 seconds using a UV lamp (HBO 200 W/DC with luminous output of 10000 lm) to initiate cross-linking in the SU8 photosensitive layer and hence render the exposed parts insoluble in the subsequently used developer. The optimal exposure time is dependent upon the intensity of illumination and any absorptive properties of the thin film layer 14. In the schematic, illumination is shown through the thin film to be patterned 14. It will also be evident that illumination can be through the substrate, provided that it is sufficiently transparent in the exposure wavelength range needed to photo-activate the radiation sensitive layer (i.e. to initiate cross-linking in the case of SU8).

The exposure of the radiation sensitive layer after deposition of the thin film layer to be patterned allows substrates coated uniformly with the radiation sensitive and thin film layers to be prepared in advance and patterned at a later stage as required.

After exposure, the substrate 10 is heated on a level hot plate according to the post-exposure baking requirements of SU8 (65° C. for a minute followed by 95° C. for another minute in the case of SU8-2 formulation).

In step 1E, the unexposed SU8 is removed using an appropriate developer, preferably propylene glycol monoether acetate (PGMEA). The requirements of the developer are threefold: (i) the unexposed SU8 must be soluble in the developer; (ii) the exposed SU8 must be insoluble in the developer; and (iii) the developer must be able to access the SU8, but not unfavorably alter the desired properties of the active PEDOT:PSS layer. In the course of the development process, the developer removes the unexposed soluble regions of SU8 along with, therefore, the corresponding overlying regions of the active PEDOT:PSS. The exposed regions of SU8 and the overlying regions of PEDOT:PSS remain after developing since the exposed SU8 is rendered insoluble to the developer by virtue of the photoinduced cross-linking. The pattern is thus effectively transferred from the negative mask to the PEDOT:PSS layer, and a patterned thin film of PEDOT:PSS is left on the likewise patterned SU8, on the substrate. The development time depends, amongst other things, on the developer used, SU8 thickness, SU8 resist formulation, and substrate characteristics, here between 1 and 3 minutes. Gentle sonication accelerates removal of the unwanted material, 5 to 10 seconds sonication after one minute soaking, for example. On completion of this process a final structure comprising a substrate, patterned SU8, and similarly patterned PEDOT:PSS remains. Following development, the final patterned structure is preferably rinsed briefly with isopropyl alcohol and then dried with a stream of diy air or nitrogen; with subsequent baking as required to drive off residual developer.

In an alternative embodiment, the thin film to be patterned is deposited after the step of SU8irradiation. This approach may be used when both substrate and thin film to be patterned are opaque to the radiation wavelength range used to initiate the chemical reaction within the intermediate photoresist material. This approach might also be used when the thin film to be patterned is unfavorably sensitive to the radiation wavelength range used to initiate the chemical reaction within the intermediate photoresist material. This approach might also be used when the thin film to be patterned is opaque, even when the substrate is not, especially when high-resolution patterns need to be formed for which the photomask is placed in close proximity to the photoresist material or when the substrate is unfavorably sensitive to the radiation wavelength range used to initiate the chemical reaction within the intermediate photoresist material.

Figure 2:
FIG. 2 shows optical micrographs of patterned SU8-10/Baytron P layers on different substrates: A: glass epoxy, B: glass; C: silicon and D: PET.
Figure 2:
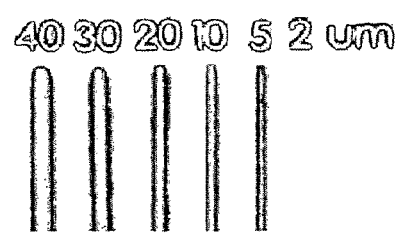
Figure 2:
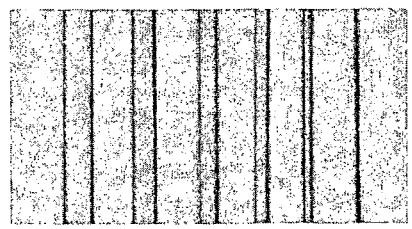
Figure 2:
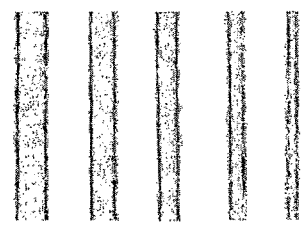

In FIG. 2, optical micrographs of patterned SU8-10/Baytron P on (A) electrical circuit board (glass epoxy Fr4 board), (B) glass, (C) silicon and (D) PET are shown. The widths of the patterned lines are 40, 30, 20, 10, 5 and 2 μm. In the case of glass and Fr4 board, for illustrative purposes only, the procedure was used to pattern the SU8-10/Baytron P into the shape of numerical digits of approximate dimensions 250× 375 μm. In order to obtain reasonable sized images of the numerical digits, a lower magnification is used for the films on glass and Fr4 than for those on silicon and PET so that the line thicknesses appear somewhat wider for the latter two samples.

Figure 3:
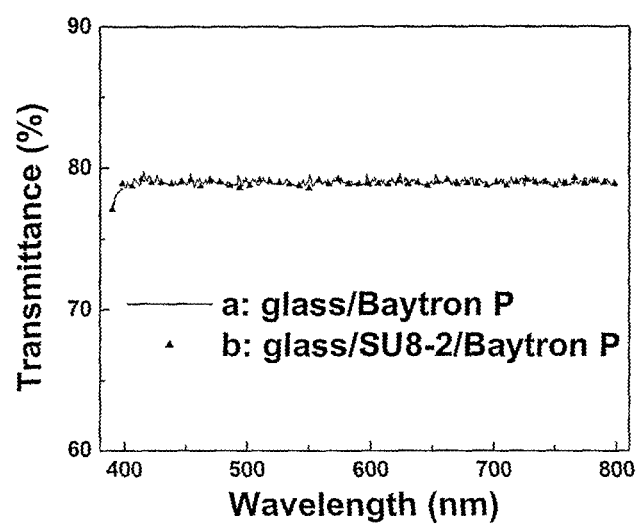
FIG. 3 shows transmission spectra for A: Baytron P on glass and B: patterned SU8-2/Baytron P on glass.

The favorable optical characteristics of SU8 mean that its presence in the form of an intermediate photoresist layer does not adversely affect the transmission of light through the film and substrate. Transmission spectra for (A) Baytron P on glass and (B) patterned SU8- 2/Baytron P on glass are shown in FIG. 3. The thickness of the SU8-2 was 1.2 μm. There are no significant differences in the transmission spectra of the two samples, indicating that the presence of the SU8-2 intermediate photoresist layer does not appreciably reduce optical transmission, an important feature for display devices, photodetectors and the like, in which light is required to either exit from or enter into the device structure via the substrate and the SU8 layer.

Figure 4:
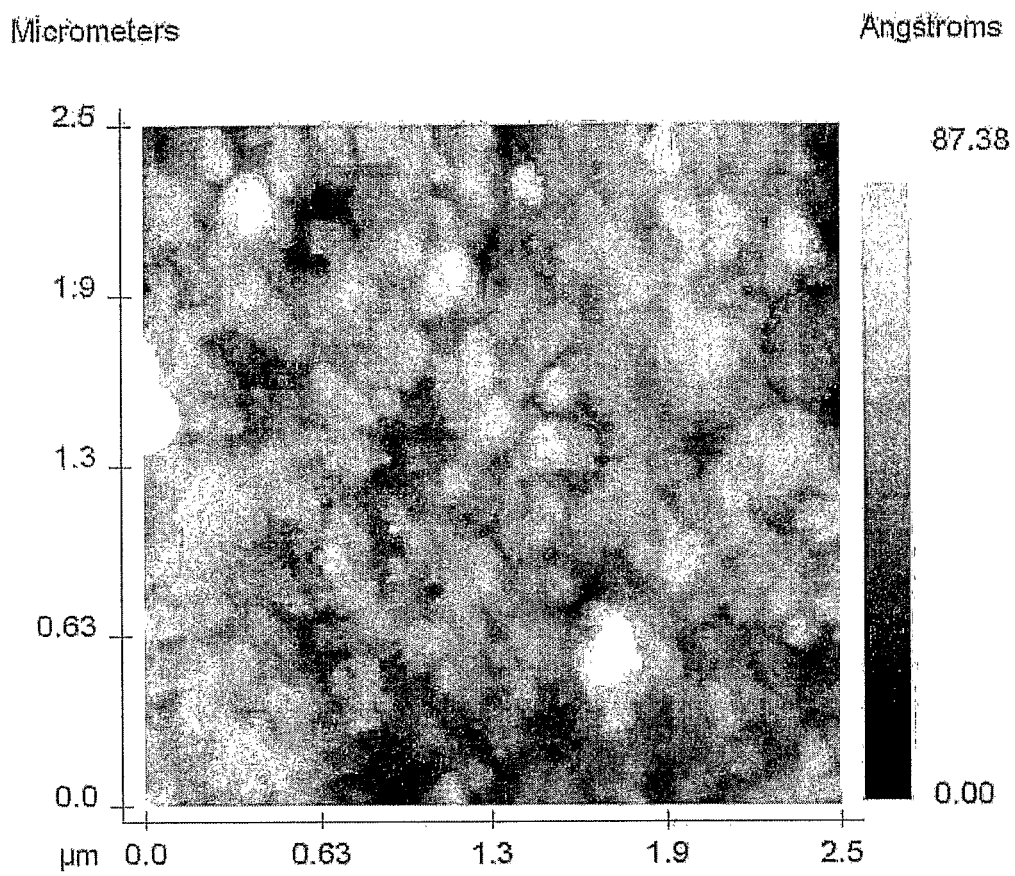
FIG. 4 shows atomic force micrograph and cross-section traces for A: Baytron P on glass and B: patterned SU8-2/Baytron P on glass, patterned according to the first embodiment.
Figure 4:
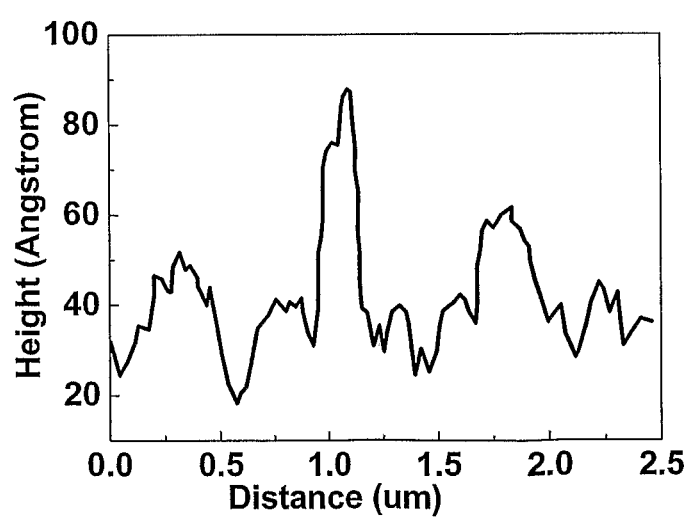
Figure 4:
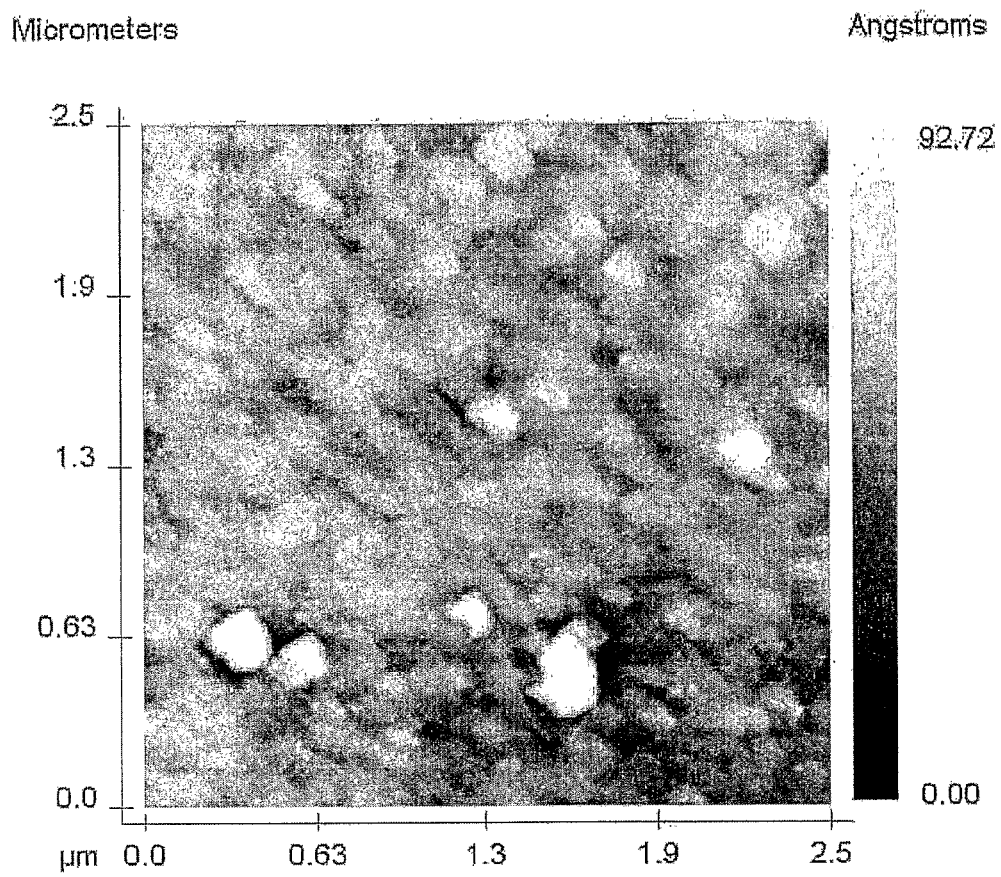
Figure 4:
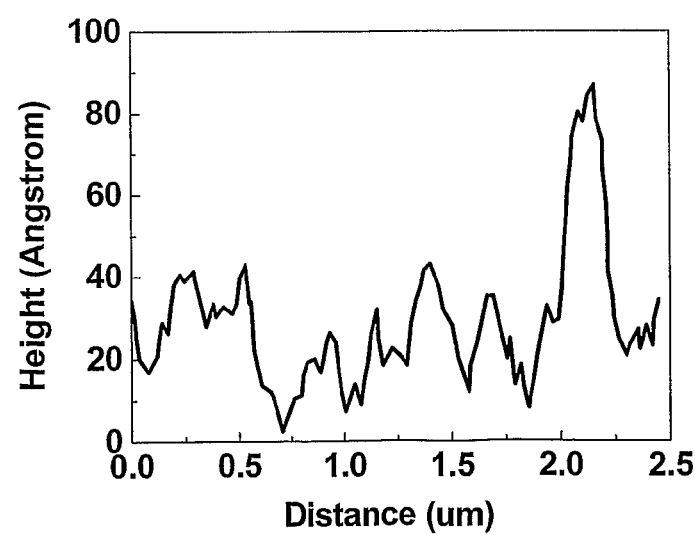

There is no unfavorable effect on the uniformity of the thin film to be patterned. Atomic force micrographs and cross-section traces for (A) PEDOT:PSS spin-coated on glass and; (B) SU8-2/PEDOT:PSS spin-coated on glass and then patterned using the method of the present invention are shown in FIG. 4. The thickness of the SU8-2 is 1.2 μm. There are no significant differences between the two samples, indicating that the patterning of the PEDOT:PSS using the SU8-2 intermediate photoresist layer method does not appreciably increase the roughness of the PEDOT:PSS film. In the case of substrate materials with rough surfaces, the presence of the SU8 intermediate photoresist layer can favorably reduce the surface roughness of the thin film layer to be patterned (i.e. the SU8 has a planarizing effect).

Furthermore, for example, in the case of the patterning of conducting and semiconducting polymers, the electrical properties (conductivity, work function) of the thin film to be patterned remain favorably undiminished by the patterning process and/or the presence of the underlying intermediate photoresist layer. Specific results for PEDOT:PSS are listed in Table 1.

TABLE 1

The conductivity and work function of Baytron P PEDOT:PSS films before and after patterning, prepared according to the method of FIG. 3. There are no significant differences between the two samples, indicating that the presence of the SU8-2 intermediate layer does not adversely affect the electrical properties.

|  | Conductivity (S/cm) | Work function (eV) |
| --- | --- | --- |
| Baytron P on glass (Average of ten measurements) | 2.54 ± 0.38 | 4.91 ± 0.18 |
| Baytron P on patterned SU8-2 coated glass (Average of ten measurements) | 3.81 ± 0.25 | 5.06 ± 0.11 |

Figure 5:
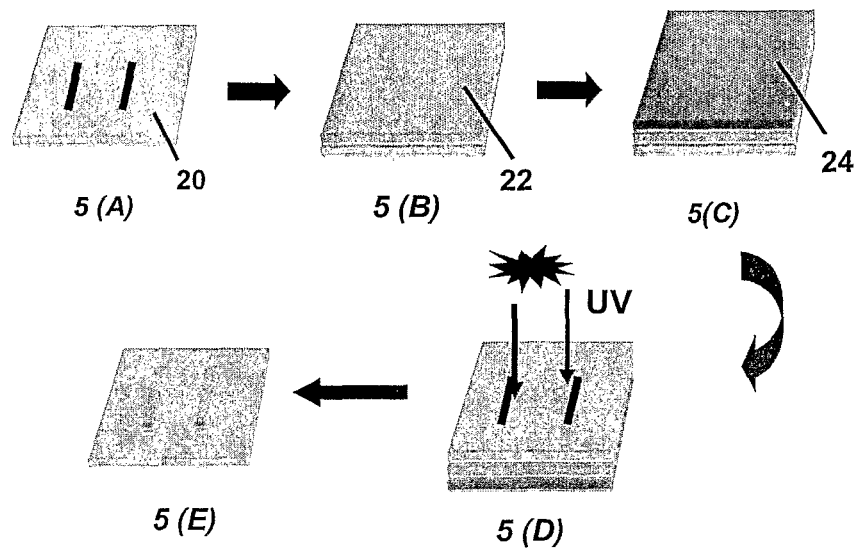
FIG. 5 is a schematic illustration of the deposition of layers and radiation of a thin film through a patterned substrate according to a second embodiment of the present invention.

According to a second embodiment illustrated in FIG. 5, a substrate 20 is pre-patterned in step 5A. A patterned-mask of aluminum, 100 nm thick, is deposited on the top side of the substrate by thermal evaporation and subsequently patterned. The pre-patterning is effective as a self-aligning mask, obviating the need for a separate mask aligner to ensure registration between the substrate and the mask. An intermediate layer 22 of SU8-2 (step 5B) and thin film layer 24 of PEDOT:PSS (step 5C) are applied on top of the patterned aluminum layer as described in the first embodiment, and a corresponding method of exposure to UV light through the patterned aluminum mask layer (step 5D) is carried out after baking as previously described. Subsequent removal in developer of unexposed SU8-2 and overlying PEDOT:PSS is carried out as previously described (step 5E). In an alternative embodiment the aluminum photomask can be placed on the underside of the substrate. It is evident that a plurality of metals and other opaque materials can be used to form the mask layer and that a plurality of methods can be used to produce the required mask pattern of the mask layer. It is further evident that the method can be applied to patterning a variety of thin film layers, including but not limited to organic semiconductors, conductors and insulators. The use of a mask layer comprising a pattern that can serve as the source and drain or gate contacts for field effect transistors offers an advantageous method to produce a field effect transistor structure in which the gate and source and drain contacts are favorably aligned.

Figure 6:
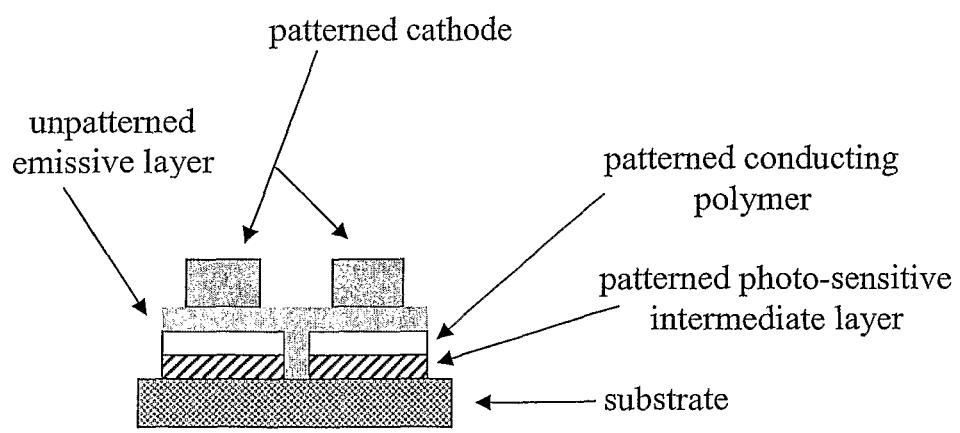
FIG. 6 is a schematic illustration of a pair of single layer LEDs or photodetectors with conducting polymer electrodes patterned according to the present invention.
Figure 7:
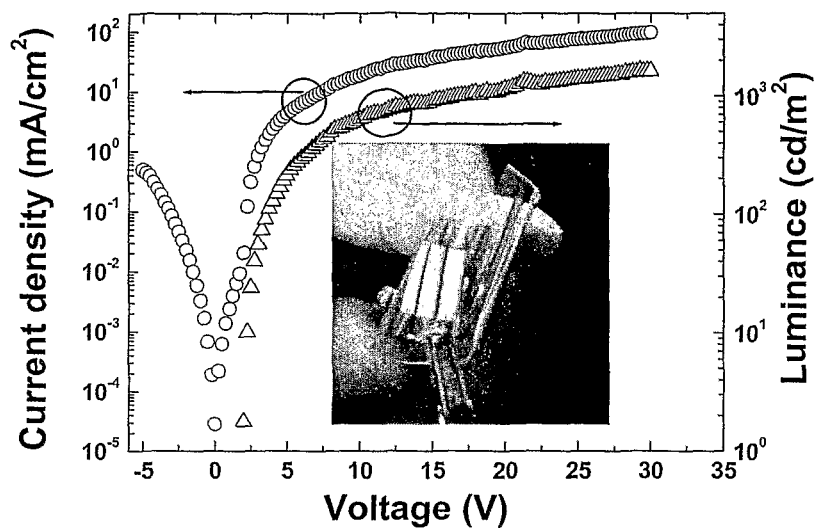
FIG. 7 shows the current density-voltage (O) and luminance-voltage (triangle) characteristics of an LED fabricated on a flexible PET substrate; with inset photograph showing the same device in operation.

The patterning method of the present invention can be applied to the fabrication of a plurality of thin film device structures. For example, according to another aspect of the present invention, shown in FIG. 6, a semiconducting polymer LED 30 is fabricated using Baytron P supplied by H.C. Starck GmbH as the anode, patterned on an SUS-2 32 coated PET flexible substrate 34. The SU8/patterned Baytron P coated PET substrate is prepared as described above. After rinsing briefly in isopropyl alcohol, the patterned substrate is heated at 120° C. for 20 minutes in a dry nitrogen atmosphere to anneal the Baytron P film. The patterned substrate is then spin-coated with 40 nm of Baytron P VP AI 4083—a low conductivity formulation of PEDOT:PSS, also supplied by H.C. Starck GmbH. The inclusion of this layer results in devices of substantially higher quality than those using Baytron P alone. The coated substrate is annealed again at 120° C. for 20 minutes in a dry nitrogen atmosphere. Polyfluorene derivatives, Poly(9,9-dioctylfluorene-co-benzothiadiazole) (F8BT) and poly(9,9-dioctylfluorene-co-N-(4-butylphenyl) diphenylamine) (TFB) are used as emitting and hole transport materials, respectively. A 90 nm TFB:F8BT layer is spin-coated on top of the PEDOT:PSS layer from a 1:1 blend by weight of the two components in xylene. The films are dried at 60° C. for two hours in a dry nitrogen atmosphere. Finally, top contacts of LiF (1 nm) and Al (100 nm) are thermally deposited though a mechanical mask onto the polymer film in vacuo ($2\times10^{-6}$ mbar). The overlapping areas of Baytron P patterned by the method of the present invention and the patterned cathode metal define the emitting area (~1.5 mm$^2$). The characteristics of such a device are shown in FIG. 7. The inset shows a photograph of the device in operation. The peak efficiencies (12 lm/W and 9 cd/A) are very similar to those obtainable for devices with the same polymer blend but fabricated conventionally on indium tin oxide (ITO) coated glass substrates. It is evident that the method of the present invention is suitable for fabricating polymer LEDs and further that the method of the present invention is suitable for fabricating polymer LEDs on flexible plastic substrates.

Figure 8:
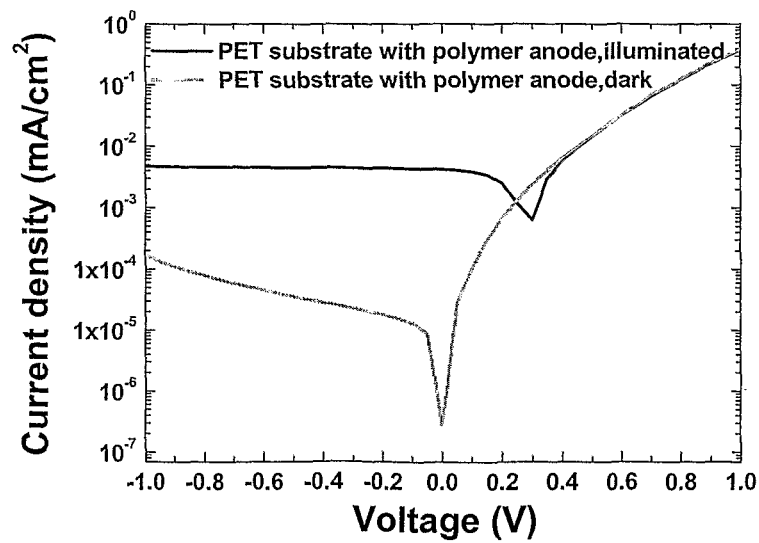
FIG. 8 illustrates the current-voltage characteristics of a photovoltaic device fabricated on a flexible PET substrate.

According to another embodiment of the present invention efficient organic photodiodes (photodetectors and solar cells) may be fabricated. The Baytron P is patterned using the method of the present invention, in the same manner as for the F8BT/TFB conjugated polymer blend LED whose characteristics are shown in FIG. 7. A 90 nm layer of poly(3-hexylthiophene) (P3HT) and 1-(3-methoxycarbonyl)-propyl-1-phenyl-(6,6)$C_{61}$ (PCBM) is then deposited from a 1:1 blend by weight of the two components in dichlorobenzene in place of the F8BT/TFB blend that is used in the LED. Finally, 100 nm of Al is thermally evaporated onto the P3HT/PCBM polymer/fullerene blend layer; the active area is again ~1.5 mm². The completed devices are thermally annealed at 120° C. in a nitrogen atmosphere for 30 mins prior to use. The current-voltage characteristics of a typical such photodiode fabricated on a flexible PET substrate, are shown in FIG. 8. The devices were illuminated via the anode using 555 nm light of total power 0.26 µW. The devices exhibited high external quantum efficiencies of ~50%, very comparable to standard photodiodes based on the same active layer but fabricated by conventional means on ITO-coated glass substrates. It is evident that the method of the present invention is suitable for fabricating polymer photodiodes and it is further evident that the method of the present invention is suitable for fabricating polymer photodiodes on flexible plastic substrates.

According to a further embodiment of the present invention metal and metal hybrid films such as single layers of aluminum and bilayers of PEDOT:PSS/Al respectively may be patterned. A film of SU8-2 is pre-coated onto clean glass or PET substrates as described above. The coated substrate is transferred to a thermal evaporator, where a 50 nm film of aluminum is deposited onto the SU8-2 without using a mask. A further film of PEDOT:PSS can be deposited on top of the aluminum layer by spin coating or other suitable means as desired. After completion of these deposition processes, the SU8-2 is photo-exposed using an appropriately structured photomask. The aluminum films are opaque, so post-deposition UV exposure has to be through the transparent glass or PET substrate. The films are developed, post exposure, as previously described, with sonication proving useful to increase the rate of removal of the unexposed SU8 and overlying films of aluminum or Al/PEDOT:PSS. Alternatively, the above process can be modified so that the SU8-2 film is exposed prior to the deposition of the aluminum layer. It is evident that the method of the present invention is suitable for fabricating conducting tracks and electrode patterns. It is further evident the method of the present invention is suitable for fabricating conducting tracks and electrode patterns on flexible plastic substrates.

Figure 9:
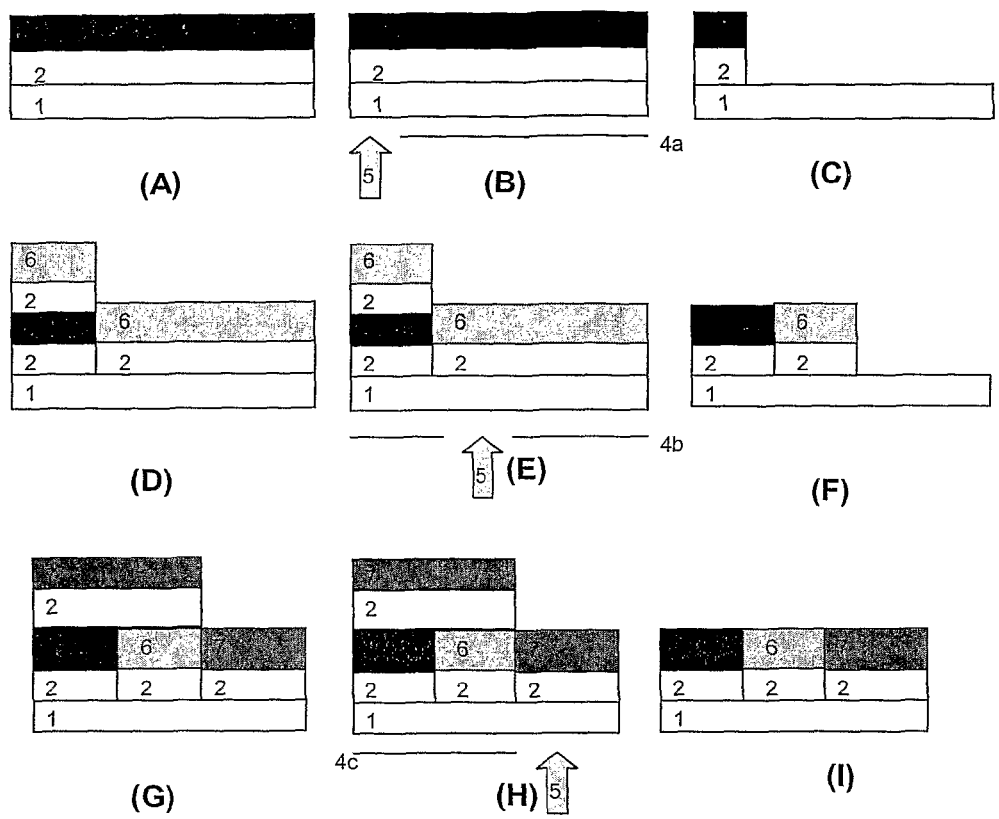
FIG. 9 is a schematic illustration of the patterning method of the present invention applied to patterning of multiple materials on a common substrate as required to produce, for example, a color filter layer for a colour liquid crystal display.
Figure 10:
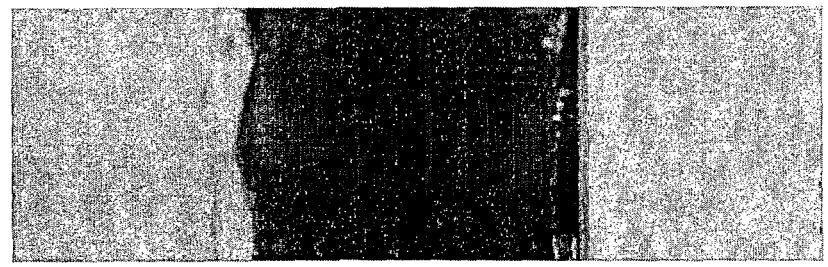
FIG. 10 is a photograph of the photoluminescence from three colored pixels based on PF-red, PF-green and PF- blue, prepared as illustrated in FIG. 9.

According to another embodiment, shown in FIG. 9, sequential patterning of multiple thin film materials on a single substrate is possible using the method of the present invention. Here SUS-10 is used as the photosensitive intermediate layer and three typical polyfluorene derivatives (often used in light-emitting diode devices), denoted for simplicity PF-Blue, PF-Green and PF-Red, are sequentially patterned. The method used is shown schematically in FIG. 9 and includes the following key steps: Step A successive deposition of the photosensitive material (2) and the first polyfluorene (from 15 mg/ml toluene solution) (3) on the substrate (1); Step B exposure of the photosensitive material via a photomask (IA) with UV radiation (5); Step C treatment with developer to remove the soluble part of the photosensitive material along with the unwanted portion of the overlying first polyfluorene layer; Step D successive deposition of the photosensitive material (2) and the second polyfluorene (from 15 mg/ml toluene solution) (6) on top of the coated substrate (1); Step E exposure of the photosensitive material via a photomask (1B) with UV radiation (5); Step F treatment with developer to remove the soluble part of the photosensitive material along with the unwanted portion of the overlying second polyfluorene layer; Steps G-I repeat of steps D-F with the third polyfluorene (from 15 mg/ml toluene solution) (7) using photomask (1C). A photograph of the photoluminescence emission from PF-Blue, PF-Red, and PF-Green films prepared in this way is presented in FIG. 10. It is evident that the method of the present invention is suitable for fabricating a multicomponent pattern on a single substrate. Such a process might be favorably applied to the fabrication of a color filter layer for a full colour (R,G,B) liquid crystal display.

Figure 11:
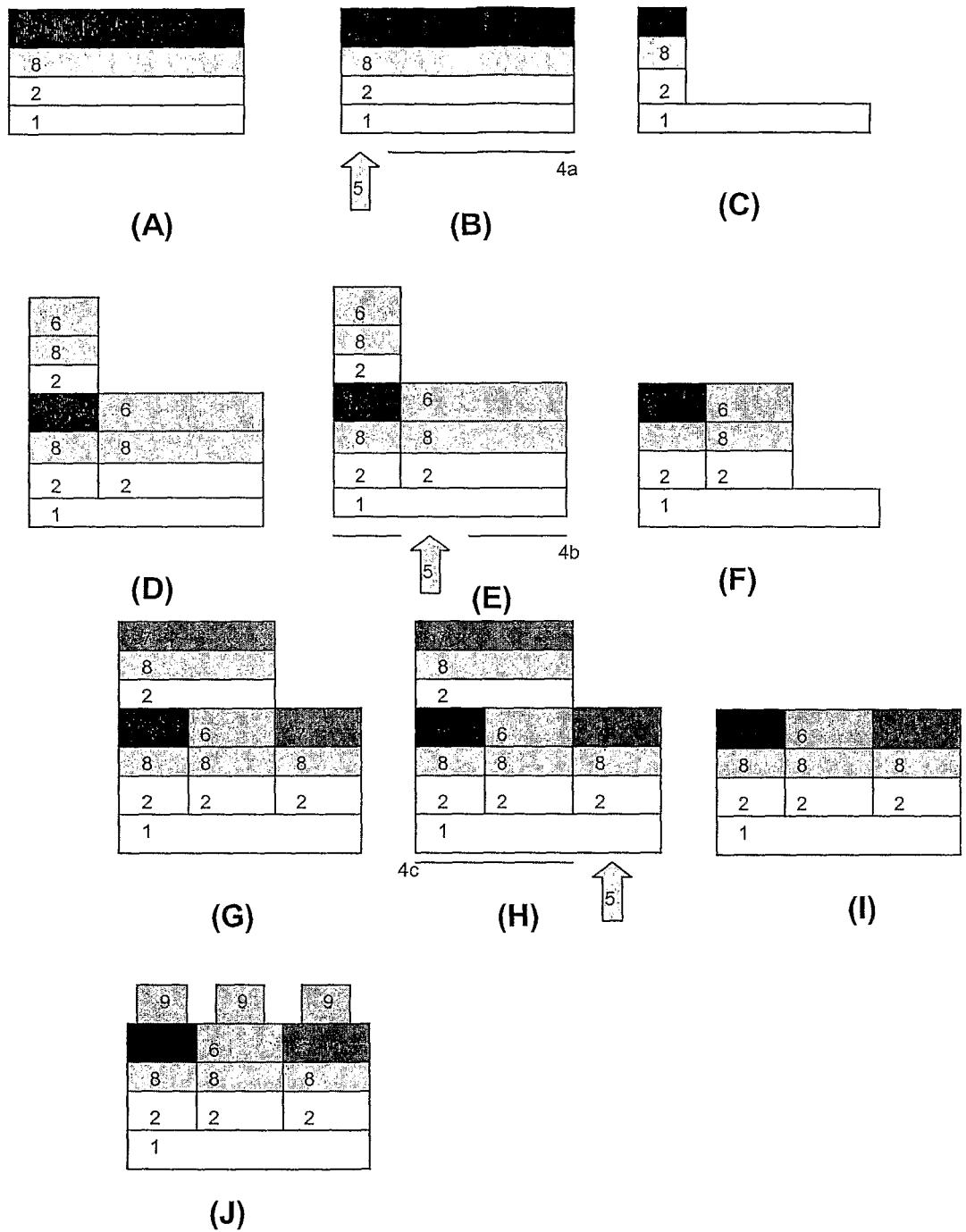
FIG. 11 is a schematic diagram of the patterning method of the present invention used to define red, green and blue picture elements (pixels) of e.g. a color display.
Figure 12:
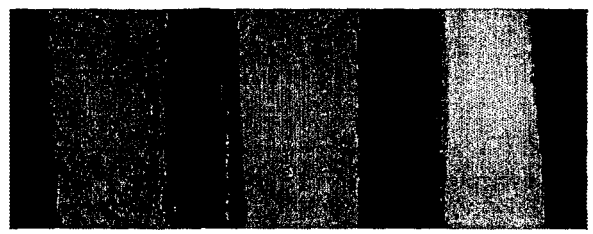
FIG. 12 is a photograph of the photoluminescence from the three colored pixels on top of Baytron P before deposition of the top electrode.
Figure 13:
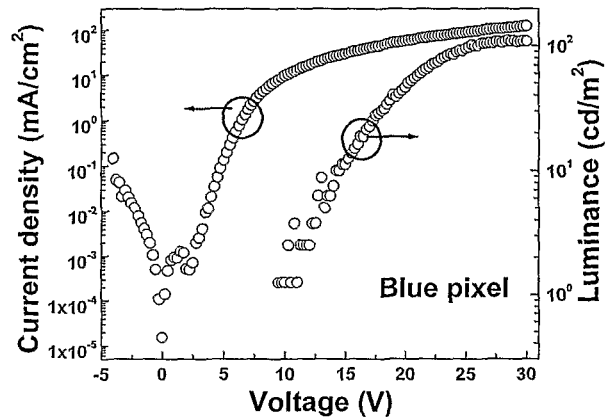
FIG. 13 shows the current-voltage-luminance characteristics of the red, green and blue pixels.
Figure 13:
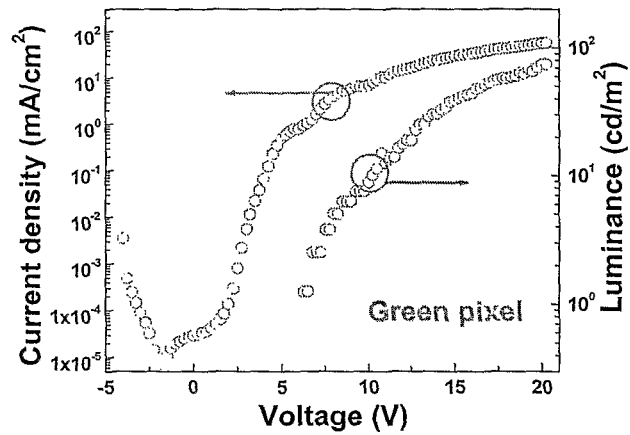
Figure 13:
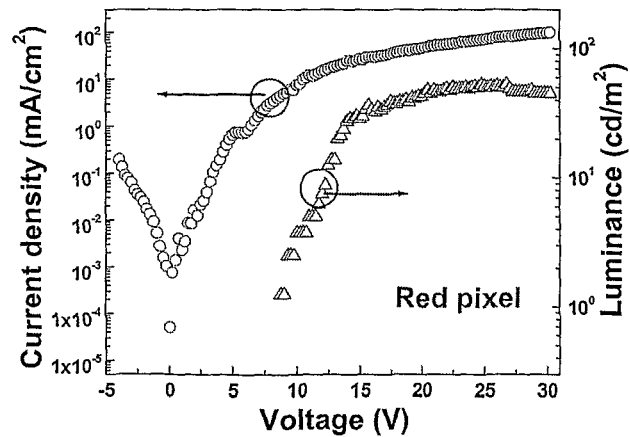
Figure 14:
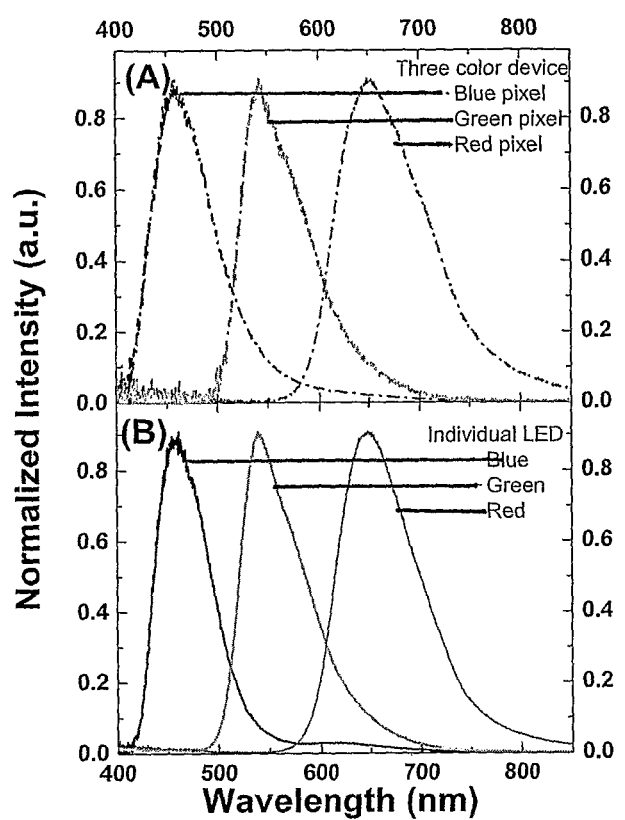
FIG. 14 shows an EL spectra for the three pixels of FIG. 13 (see (A) dash lines). EL spectra for individual red, green and blue LEDs fabricated on separate substrates (see (B) solid lines) are shown for comparison.

The method of the present invention may be further extended to patterning, on a single substrate, a plurality of devices based on different component materials. A specific embodiment is the fabrication of red, green and blue organic light-emitting diodes. The procedure adopted is illustrated in FIG. 11 and is identical to that described in FIG. 9 for steps (A) to (I), except that layers of Baytron P and Baytron P VP AI 4083 (8) are sequentially spin-coated at 2000 rpm for 3 min on top of the SU8-10, prior to deposition of the appropriate light-emitting polymer layer. The red, green and blue emission polymers are separately dissolved in toluene to make 10% by weight solutions that can be used to form 80-100 nm films by spin-coating. The device is completed in step (J) by thermal evaporation of an appropriate cathode material (9). The uniformity of photoluminescence emission is noticeably better for these structures that contain PEDOT:PSS than for structures that do not (compare FIG. 12 with FIG. 10). It is believed that the PEDOT:PSS layer(s) planarise the SU8 surface and prevent direct contact between the SU8 layer and toluene—an occurrence that may cause a slight roughening of the SU8 surface. Typical device characteristics are shown in FIG. 13 and the corresponding emission spectra are shown in FIG. 14. It is evident that the method of the present invention allows sequential patterning of a plurality of devices, comprised of different materials types, on a single substrate.

The same procedure can be readily extended to a full color display by preparing a plurality of red, green, and blue picture elements (pixels) arranged in an appropriate spatial pattern and with appropriate pixel dimensions (dictated by the required resolution). In the case of passive and active matrix displays, it may be advantageous for the photoactive intermediate layer to be conductive in order to provide an electrical connection between the patterned light-emitting material and the underlying matrix. In the case of SU8 photoresist, this may be favorably achieved by the addition of conductive dopants such as Ag nanoparticles or fullerenes to the photoresist solution.

It will be evident to a person skilled in the art that the embodiments described herein above are by way of example only. The method steps described can be performed in any order consistent with the present invention and may be complemented by other conventional patterning steps. It will be further evident to a person skilled in the art that variations and modifications, including but not limited to the use of an appropriate positive photoresist in place of the negative SU-8 photoresist, or the use of an e-beam or x-ray resist and e-beam or x-ray exposure procedure in place of the photoresist and optical exposure procedure, lie within the scope of the claims.

What is claimed:

1. A method of patterning a thin film layer, comprising:
   depositing an intermediate, irradiation sensitive, layer on a substrate;
   depositing the thin film layer on the intermediate layer;
   before or after deposition of the thin film layer;
      exposing the intermediate layer to patterned radiation in order to initiate a chemical reaction therein:
      removing, by soaking in a developer in a single developmental step, patterned radiation-defined parts of the intermediate layer along with corresponding thin film, to leave patterned thin film and patterned intermediate layer on the substrate; and in which the substrate comprises a polyethyleneterpthalate (PET) film, the intermediate layer comprises epoxidized bisphenol-A/formaldehyde novolac co-polymer (SU8); and the thin film comprises poly(3,4-ethylenedioxythiophene):poly(styrenesulphonate) (PEDOT:PSS).

2. The method of claim 1, in which the intermediate layer comprises a negative resist material; and the step of removing comprises removing unexposed parts.

3. The method of claim 1, in which the intermediate layer comprises a positive resist; and the step of removing comprises removing exposed parts.

4. The method of claim 1, in which the radiation is selected from the group consisting of optical wavelengths, ultra-violet wavelengths, wavelengths between 300 and 400 nm, X-ray wavelengths, and an electron beam.

5. The method of claim 1, in which the radiation is patterned by use of a photomask.

6. The method of claim 5, in which the substrate comprises a pre-patterned layer, and the photomask comprises the pre-patterned layer.

7. The method of claim 6, in which the pre-patterned layer is contiguous with the intermediate layer.

8. The method of claim 7 in which the patterned thin film, patterned intermediate layer and substrate comprise a final device, and in which the pre-patterned layer forms an active part of the final device.

9. The method of claim 6, in which the pre-patterned layer is formed on an opposite side of the substrate to that on which the intermediate layer is deposited.

10. The method of claim 1, in which the radiation is patterned by scanning a radiation beam.

11. The method of claim 1, in which the patterned radiation comprises an interference or diffraction pattern.

12. The method of claim 1, in which the radiation is patterned using a device selected from the group consisting of a spatial light modulator, micro-minor device; and by selectively addressing a microarray of emission sources.

13. The method of claim 1 in which the intermediate layer is irradiated from whichever one of the substrate, or thin film side if deposited, is most transparent to the radiation.

14. The method of claim 1 in which the chemical reaction is at least one of cross-linking, polymerization, chain scission, and oxidation.

15. The method of claim 1 in which the thin film is selected from the group consisting of a conductor, semiconductor, and insulator.

16. The method of claim 1 in which the thin film is selected from the group consisting of a polymer, a light-emitting polymer, a dendrimer, a light-emitting dendrimer, an organic small molecule, a light emitting organic small molecule, a metal, an inorganic semiconductor, and an inorganic dielectric.

17. The method of claim 1 in which the thin film is selected from the group consisting of a single material type, a blend of two or more materials types, and a combination of sequentially deposited layers of two or more materials.

18. The method of claim 1 in which the substrate is selected from the group consisting of a glass, metal, plastic, paper, conductor, semiconductor, and insulator; which is rigid, flexible, transparent or opaque.

19. The method of claim 1 in which the step of removing patterns the intermediate and layer thin film simultaneously.

20. A thin film structure comprising a substrate; and an intermediate layer and a thin film patterned according to the method of claim 1.

21. The thin film structure of claim 20, in which the patterned thin film, patterned intermediate layer and substrate comprise a final device, and in which the intermediate layer forms an active part of the final device.

22. A thin film structure comprising a substrate, a thin film to be patterned according to the method of claim 1; and a radiation sensitive intermediate layer.

23. A thin film structure comprising a substrate with multiple elements of different materials patterned sequentially according to the method of claim 1.

* * * * *